United States Patent
Zhang et al.

(10) Patent No.: US 12,366,704 B1
(45) Date of Patent: Jul. 22, 2025

(54) PHOTONIC INTEGRATED CHIP STRUCTURE AND FABRICATION METHOD THEREOF

(71) Applicant: Yuanjie Semiconductor Technology Co., Ltd., Xi 'an (CN)

(72) Inventors: Zhenning Zhang, Xi 'an (CN); Mahui Li, Xi 'an (CN); Yao Mu, Xi 'an (CN); Laiyan Wei, Xi 'an (CN)

(73) Assignee: Yuanjie Semiconductor Technology Co., Ltd., Xi 'an (CN)

( * ) Notice: Subject to any disclaimer, the term of this patent is extended or adjusted under 35 U.S.C. 154(b) by 0 days.

(21) Appl. No.: 19/080,495

(22) Filed: Mar. 14, 2025

(30) Foreign Application Priority Data

Sep. 10, 2024 (CN) .......................... 202411260880.6

(51) Int. Cl.
*H10D 62/10* (2025.01)
*G02B 6/12* (2006.01)
*G02B 6/13* (2006.01)

(52) U.S. Cl.
CPC ......... *G02B 6/12002* (2013.01); *G02B 6/131* (2013.01); *H10D 62/113* (2025.01)

(58) Field of Classification Search
CPC ..... G02B 6/131; H10D 62/113; H10D 62/124
See application file for complete search history.

(56) References Cited

U.S. PATENT DOCUMENTS

| 2015/0115407 A1* | 4/2015 | Tao | H10D 1/692 257/532 |
| 2021/0305290 A1* | 9/2021 | Bian | H10F 30/21 |
| 2025/0126826 A1* | 4/2025 | Cheng | H10D 62/343 |

FOREIGN PATENT DOCUMENTS

| CN | 103427332 A | * 12/2013 | |
| CN | 106019432 A | * 10/2016 | ............. G02B 5/003 |
| CN | 111580215 A | 8/2020 | |
| CN | 116190228 A | 5/2023 | |

* cited by examiner

*Primary Examiner* — Charlie Y Peng
(74) *Attorney, Agent, or Firm* — Nitin Kaushik

(57) ABSTRACT

A photonic integrated chip structure and a fabrication method thereof can effectively realize P\N electrical isolation among discrete devices in an integrated chip so as to perform P\N dual-side RF driving on the devices. The photonic integrated chip structure includes a substrate; and a buffer layer; a bottom conductive layer, formed on the buffer layer, which comprises a plurality of bottom conductive regions, wherein a bottom isolation region is arranged between two adjacent bottom conductive regions; the type of dopant in the bottom isolation region is opposite to that in the adjacent bottom conductive regions; a core layer, which comprises a plurality of core regions, wherein the core regions are in one-to-one correspondence with the bottom conductive regions; a top conductive layer, which comprises a plurality of top conductive regions, and a top isolation region is arranged between two adjacent top conductive regions.

8 Claims, 9 Drawing Sheets

PHOTONIC INTEGRATED CHIP STRUCTURE AND FABRICATION METHOD THEREOF

CROSS-REFERENCE TO RELATED APPLICATIONS

The application claims priority to Chinese patent application No. 202411260880.6, filed on Sep. 10, 2024, the entire contents of which are incorporated herein by reference.

TECHNICAL FIELD

The present disclosure relates to a photonic integrated chip structure and a fabrication method thereof, and belongs to the technical field of semiconductor lasers.

BACKGROUND

A photonic integrated chip is a device structure formed by integrating a plurality of independent photonic devices onto the same substrate, commonly involving the integration of one or more of lasers, modulators, optical amplifiers, detectors, etc., onto semiconductor III-V materials or Si substrates. Traditional photonic integrated chips are mostly based on N-type substrate materials, with all devices sharing a common N-pole. Such photonic integrated chips can only perform P-isolation on discrete photonic devices and cannot achieve N-isolation, thus necessitating individual single-ended RF driving for each device. If the P and N electrodes of each device in the photonic integrated chip can be simultaneously electrically isolated, it can significantly reduce crosstalk between devices, thereby enabling P\N dual-side RF driving of the photonic chip.

A common way of electrical isolation in photonics integrated chips is the use of deep etch structures, where the P-type material between two devices is completely or partially etched to significantly increase the P-isolation resistance between devices, thereby blocking crosstalk between their P-electrodes. Although we can also etch the N-type material on the substrate side to achieve N-isolation, the various optical devices on the integrated chip generally require heat dissipation through the substrate. Etching the N-type material on the substrate side will greatly increase the thermal resistance, leading to a significant increase in the junction temperature of the optical devices. This not only limits the operating current of the optical devices but also significantly increases the reliability risk of the devices.

Electrical isolation between chips can also be achieved through ion implantation and diffusion. To avoid the impact of implanted particles or diffused elements on epitaxial growth, both implantation and diffusion need to be performed after epitaxy is completed. In this case, due to the deep implantation depth required, very high particle implantation energy is needed. This not only makes the equipment expensive but also subjects the epitaxial material to uncontrollable effects on its optical properties caused by high-energy particles. For diffusion solutions, especially those requiring material type inversion for electrical isolation, a relatively deep diffusion depth and a higher diffusion concentration are necessary. This leads to increased diffusion time, and a large amount of diffused elements will increase the loss of optical waveguides. Furthermore, these diffused elements are unstable in subsequent processes and can affect the reliability of the devices.

SUMMARY

The present disclosure provides a photonic integrated chip structure and a fabrication method thereof, can effectively realize PIN electrical isolation among discrete devices in an integrated chip so as to perform P\N dual-side RF driving on the devices.

In one aspect, the disclosure provides a photonic integrated chip structure, including:
  a substrate;
  a buffer layer, formed on the substrate;
  a bottom conductive layer, formed on the buffer layer, which includes a plurality of bottom conductive regions, wherein a bottom isolation region is arranged between two adjacent bottom conductive regions, the bottom isolation region is configured to isolate two adjacent bottom conductive regions; the type of dopant in the bottom isolation region is opposite to that in the adjacent bottom conductive regions;
  a core layer, formed on the bottom conductive layer, which includes a plurality of core regions, wherein the core regions are in one-to-one correspondence with the bottom conductive regions; and
  a top conductive layer, formed on the core layer, which includes a plurality of top conductive regions, wherein the top conductive regions are in one-to-one correspondence with the core regions, and a top isolation region is arranged between two adjacent top conductive regions.

Optionally, an optical transmission region is arranged between two adjacent core regions.

Optionally, the type of dopant in the bottom conductive region is opposite to that in the buffer layer; and the type of the substrate is P-type, N-type or semi-insulating.

Optionally, the top isolation region is formed by an etching process or a doping process; a width of the top isolation region is greater than a width of the optical transmission region; and a distance between a left edge of the top isolation region and a left edge of the optical transmission region and a distance between a right edge of the top isolation region and a right edge of the optical transmission region are both greater than or equal to 1 um.

Optionally, the bottom isolation region is a P-doped or N-doped semiconductor layer.

Optionally, a thickness of the bottom conductive region is greater than or equal to 500 nm; and a difference in thickness of the bottom isolation region and the bottom conductive region is no more than 300 nm; a distance between a left edge of the bottom isolation region and a left edge of the optical transmission region and a distance between a right edge of the bottom isolation region and a right edge of the optical transmission region are both less than or equal to 10 um.

Optionally, the material of the optical transmission region is a multinary semiconductor compound.

In another aspect, the disclosure provides a fabrication method based on the photonic integrated chip structure according to any one of the foregoing, the method including:
  forming a buffer layer on a substrate;
  forming a bottom isolation region on the buffer layer, and forming bottom conductive regions on both sides of the bottom isolation region;
  forming corresponding core regions on the bottom conductive regions; and
  forming corresponding top conductive regions on the core regions, and forming a top isolation region between two adjacent top conductive regions.

Optionally, after forming corresponding core regions on the bottom conductive regions, the method further includes:

forming an optical transmission region between two adjacent core regions.

Optionally, forming the bottom isolation region on the buffer layer, and forming the bottom conductive regions on both sides of the bottom isolation region specifically includes:

forming a bottom isolation layer on the buffer layer, and performing an etching process on the bottom isolation layer to obtain a bottom isolation region; and epitaxially growing bottom conductive regions on regions on both sides of the bottom isolation region on the buffer layer.

The beneficial effects that can be produced by the disclosure include:

the photonic integrated chip structure provided by the disclosure achieves electrical isolation at the bottom by arranging a bottom isolation region between two adjacent bottom conductive regions, with the type of dopant in the bottom isolation region being opposite to that in the adjacent bottom conductive regions, thereby forming an inversion blocking junction. Electrical isolation between two adjacent top conductive regions is achieved through a top isolation region. This realizes P\N electrical isolation among the discrete devices within the integrated chip, enabling P\N dual-side RF driving of the devices without cross-talk interference to other devices.

REFERENCE SIGNS 100, first sub-device; 200, second sub-device; 10, substrate; 20, buffer layer; 31, first bottom conductive region; 32, second bottom conductive region; 33, bottom isolation region; 34, bottom isolation layer; 41, first core region; 42, second core region; 43, optical transmission region; 44, first core layer; 51, first top conductive region; 52, second top conductive region; 53, top isolation region; 54, first conductive layer; 61, first mask.

DETAILED DESCRIPTION OF THE EMBODIMENTS

The present disclosure will now be described in detail with reference to embodiments, but the present disclosure is not limited to these embodiments.

Figure 1:
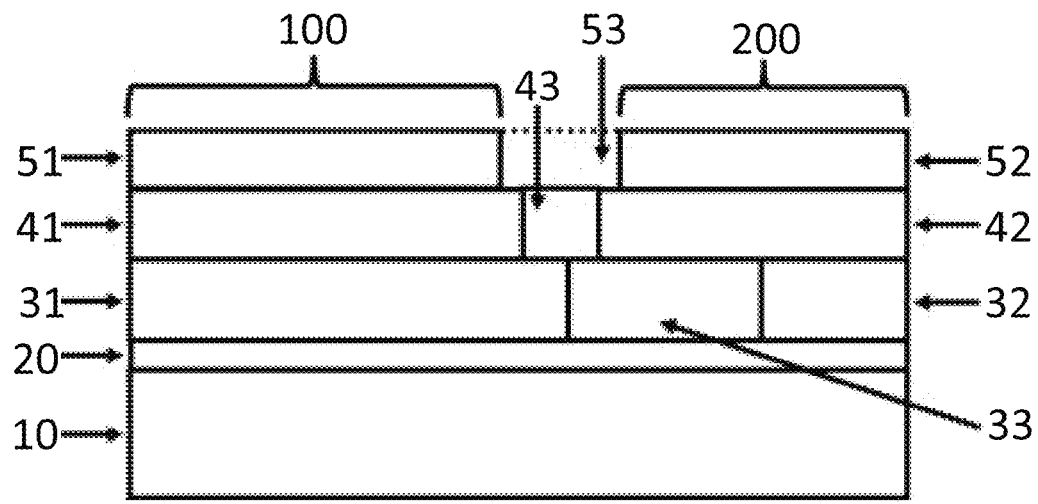
FIG. 1 is a schematic cross-sectional view of a photonic integrated chip structure according to an embodiment of the disclosure.

An embodiment of the present disclosure provides a photonic integrated chip structure, as shown in FIG. 1, including:

a substrate 10.

The substrate 10 may be provided as a P-type, N-type or semi-insulating semiconductor; the P-type dopant may be Zn, the N-type dopant may be S or Si, and the semi-insulating type dopant may be Fe.

The material of the substrate 10 may be an InP or GaAs material or the like, and embodiments of the present disclosure are not limited thereto.

The structure includes a buffer layer 20 formed on the substrate 10.

The buffer layer 20 may be provided as a P-type, N-type, non-doped or semi-insulating semiconductor to achieve isolation between the sub-devices thereon and the substrate 10; the P-type dopant may be Zn, the N-type dopant may be S or Si, and the semi-insulating type dopant may be Fe; and the material of the buffer layer 20 may be an InP or GaAs material or the like, and embodiments of the present disclosure are not limited thereto.

The structure includes a bottom conductive layer, formed on the buffer layer 20, which includes a plurality of bottom conductive regions, a bottom isolation region 33 is arranged between two adjacent bottom conductive regions, the bottom isolation region 33 is configured to isolate the two adjacent bottom conductive regions; the type of dopant in the bottom isolation region 33 is opposite to that in the adjacent bottom conductive regions.

Wherein, the bottom isolation region 33 is a P-doped or N-doped semiconductor layer, and the type of dopant in the bottom conductive region is opposite to that in the buffer layer 20. The thickness of the bottom conductive region is generally greater than or equal to 500 nm; the difference in thickness of the bottom isolation region 33 and the bottom conductive region is generally no more than 300 nm.

Embodiments of the present disclosure are illustrated by forming two sub-devices on the buffer layer 20. The two sub-devices are denoted as a first sub-device 100 and a second sub-device 200. The first sub-device 100 and the second sub-device 200 may be a laser, a modulator, an optical amplifier, or the like.

Taking two sub-devices as an example, two bottom conductive regions are formed on the buffer layer 20, which are noted as first bottom conductive region 31 and second bottom conductive region 32, respectively, the first bottom conductive region 31 and the second bottom conductive region 32 may be provided as a P-type doped or N-type doped semiconductor, the bottom isolation region 33 arranged between the first bottom conductive region 31 and the second bottom conductive region 32 may then be an N-doped or P-doped semiconductor, the polarity of the bottom isolation region 33 is different from that of the bottom conductive region, so that an inversion blocking junction can be formed to achieve bottom electrical isolation.

In the actual manufacturing process, SiOx or SiNx can be deposited on the surface of the bottom isolation layer 34 as a mask to selectively etch other regions, thus forming the bottom isolation region 33. Subsequently, the first bottom conductive region 31 and the second bottom conductive region 32 are epitaxially grown on both sides of the bottom isolation region 33, respectively. The etching of the bottom isolation layer 34 can be achieved through dry etching or wet etching.

The structure includes a core layer formed on the bottom conductive layer, which includes a plurality of core regions, the core regions being in one-to-one correspondence with the bottom conductive regions.

Taking two sub-devices as an example, two core regions are formed on the bottom conductive layer, which are denoted as a first core region 41 and a second core region 42, and may be directly connected or have an optical transmission region 43 made of other materials grown in between for interfacing; the relative positions of the optical transmission region 43 and the bottom isolation region 33 are not fixed, that is, the left end face of the optical transmission region 43 can be located on the left, in the middle, or on the right of the bottom isolation region 33. Preferably, a distance between a left edge of the bottom isolation region 33 and a left edge of the optical transmission region 43 and a distance between a right edge of the bottom isolation region 33 and a right edge of the optical transmission region 43 are both less than or equal to 10 um.

The material of the optical transmission region 43 may be a multinary semiconductor compound. The first core region 41 and the second core region 42 may use the same or different epitaxial materials.

The first core region 41 and the second core region 42 each include a structure from bottom to top of a transition layer, a lower confinement layer, an active layer, an upper confinement layer, etc.; the material of the active layer can be multi-quantum wells of InGaAsP or InGaAlAs.

By epitaxially growing an optical transmission region 43 of other materials between the first core region 41 and the second core region 42, it is possible to block current crosstalk between the weakly doped confinement layers on the lower side of the core regions, further increasing the isolation effect.

After the epitaxial growth of the core region of the first sub-device 100, a partial region can be selectively removed by dry etching or wet etching to further epitaxially grow the core region of the second sub-device 200. Subsequently, the interface between the core regions of the first sub-device 100 and the second sub-device 200 is selectively etched, followed by the epitaxial growth of the optical transmission region 43.

The structure includes a top conductive layer formed on the core layer, which includes a plurality of top conductive regions, wherein the top conductive regions are in one-to-one correspondence with the core regions, and a top isolation region 53 is arranged between two adjacent top conductive regions.

The top isolation region 53 is formed by an etching process or a doping process. Specifically, the top isolation of the first sub-device 100 and the second sub-device 200 can be achieved by deep etching in specific regions to remove the top conductive regions, or by methods such as ion implantation and diffusion Preferably, the width of the top isolation region 53 is greater than the width of the optical transmission region 43; a distance between a left edge of the top isolation region 53 and a left edge of the optical transmission region 43 and a distance between a right edge of the top isolation region 53 and a right edge of the optical transmission region 43 are both greater than or equal to 1 um.

Taking two sub-devices as an example, two top conductive regions are formed on the core layer, denoted as the first top conductive region 51 and the second top conductive region 52, respectively. The materials of the first top conductive region 51 and the second top conductive region 52 can be InGaAs or InAlAs. The first top conductive region 51 and the second top conductive region 52 can be made of the same or different epitaxial materials.

In practical applications, the electrodes connected to the bottom conductive regions in both the first sub-device 100 and the second sub-device 200 cover their respective bottom conductive regions with metal and extend to a top surface, forming a coplanar electrode structure with top surface electrodes.

The photonic integrated chip structure provided by the disclosure allows for the formation of pnp or npn inversion junction isolation on the bottom conductive layer. The epitaxy-based isolation method of the disclosure can significantly reduce the concentration of doping elements, thereby mitigating the impact of impurity atoms on device performance and reliability.

Another embodiment of the disclosure provides a fabrication method based on any one of the aforementioned photonic integrated chip structures, the method including:

S1, a buffer layer 20 is formed on the substrate 10.

S2, a bottom isolation region 33 is formed on the buffer layer 20, and bottom conductive regions are formed on both sides of the bottom isolation region 33.

S3, corresponding core regions are formed on the bottom conductive regions.

S4, corresponding top conductive regions are formed on the core regions, and a top isolation region 53 is formed between two adjacent top conductive regions.

Further, after the corresponding core regions are formed on the bottom conductive regions, the method further includes: an optical transmission region 43 is formed between two adjacent core regions.

In the embodiment of the present disclosure, the step that a bottom isolation region 33 is formed on the buffer layer 20, and bottom conductive regions are formed on two sides of the bottom isolation region 33 specifically includes: first, a bottom isolation layer 34 is formed on the buffer layer 20, and an etching process is performed on the bottom isolation layer 34 to obtain the bottom isolation region 33; bottom conductive regions are then epitaxially grown on the buffer layer 20 at regions on both sides of the bottom isolation region 33.

A further embodiment of the disclosure provides a specific fabrication method of a photonic integrated chip structure, the method including:

(1) A buffer layer 20 and a bottom isolation layer 34 are epitaxially grown on the substrate 10.

Figure 2:
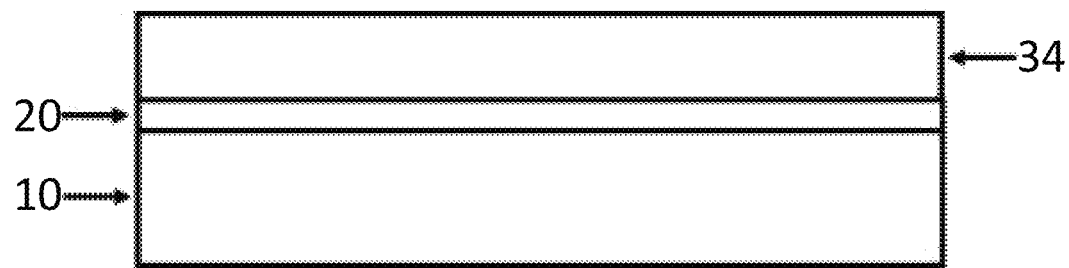
FIG. 2 is a schematic diagram of epitaxially growing a buffer layer and a bottom isolation layer on a substrate according to an embodiment of the present disclosure.

Referring to FIG. 2, at this stage, the substrate 10 may be selected to be a semi-insulating semiconductor or may alternatively be an N-doped or P-doped semiconductor.

The buffer layer 20 can be a semiconductor thin layer made of P-type InP (such as Zn-doped, with a doping concentration>1E15 cm-3), N-type InP (such as S-doped or Si-doped, with a doping concentration>1E15 cm-3), or undoped, semi-insulating InP (such as Fe-doped, with a doping concentration>1E15 cm-3) that is of opposite type to the bottom conductive layer, and is used to achieve isolation between the two sub-devices and the substrate 10.

The bottom isolation layer 34 may be a P-doped or N-doped semiconductor (doping concentration>1E15 cm-3).

The epitaxial process used in this process may be MOCVD (Metal Organic Chemical Vapor Deposition) or MBE (Molecular Beam Epitaxy).

(2) A mask is deposited on the bottom isolation layer 34 and photolithography and etching are completed.

Figure 3:
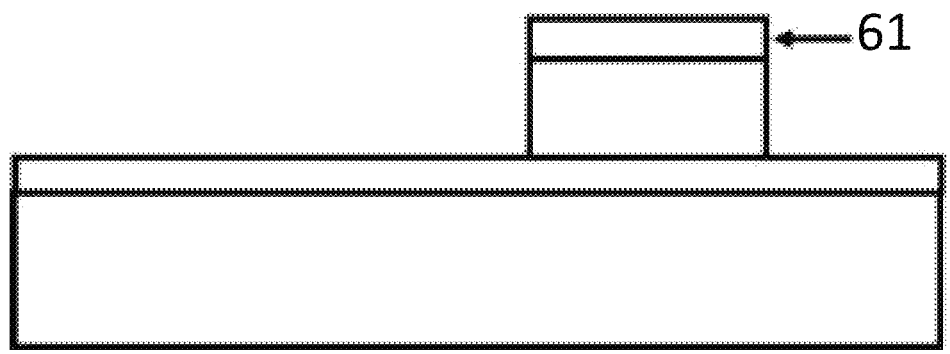
FIG. 3 is a schematic diagram of depositing a mask on the bottom isolation layer and completing photolithography and etching according to an embodiment of the present disclosure.

Referring to FIG. 3, at this stage, the mask material may be selected to be SiOx or SiNx, which exhibits lattice constant mismatch with the III-V binary or multinary compound semiconductors, and the corresponding material will not be grown during the subsequent epitaxial process, and selective region growth can be achieved.

The process begins with a photolithography step on the first mask 61 (previously mentioned as SiOx or SiNx). Then, by using the patterned photoresist as a second mask, selective region etching is performed on the first mask 61 through ICP (Inductively Coupled Plasma Etching) or RIE (Reactive Ion Etching). After the etching is completed, the second mask is removed, leaving only the bottom isolation regions 33 and the first mask 61 in specific regions on the buffer layer 20.

(3) The first bottom conductive region 31 of the first sub-device 100 and the second bottom conductive region 32 of the second sub-device 200 are epitaxially grown.

Figure 4:
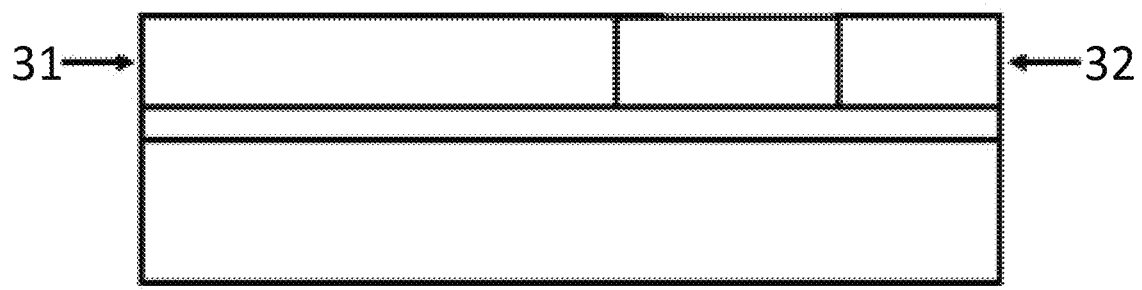
FIG. 4 is a schematic diagram of epitaxially growing bottom conductive regions of sub-devices according to an embodiment of the present disclosure.

Referring to FIG. 4, at this stage, the epitaxially grown bottom conductive region is an N-type or P-type semiconductor (such as N-InP or P-InP with a doping concentration greater than 1E18 cm-3), and it grows to a certain thickness only on the buffer layer 20 that is not covered by the first mask 61. After the epitaxial growth is completed, the remaining first mask 61 from the previous step can be removed by dry etching or wet etching. Upon completion of this process, npn or pnp reverse junction isolation can be formed laterally.

A typical thickness of the bottom conductive region is greater than 500 nm, and the thickness of the bottom isolation region 33 may be greater than, less than or equal to the thickness of the bottom conductive region.

(4) The first core layer 44 of the first sub-device 100 is epitaxially grown.

Figure 5:
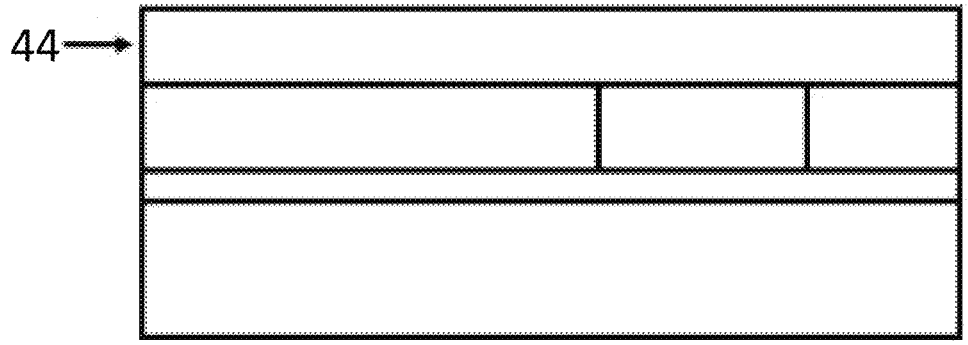
FIG. 5 is a schematic diagram of epitaxially growing a first core layer of a first sub-device according to an embodiment of the present disclosure.

Referring to FIG. 5, the first core layer 44 may include a structure of a transition layer, a lower confinement layer, an active layer, an upper confinement layer, etc., and the active layer gain medium may be a strained multiple-quantum well (MQW) structure formed of a multinary compound semiconductor, such as InGaAsP or InGaAlAs, and having a thickness greater than 10 nm.

(5) The second core region 42 of the second sub-device 200 is epitaxially grown after selectively etching a partial region of the first core layer 44 of the first sub-device 100.

Figure 6:
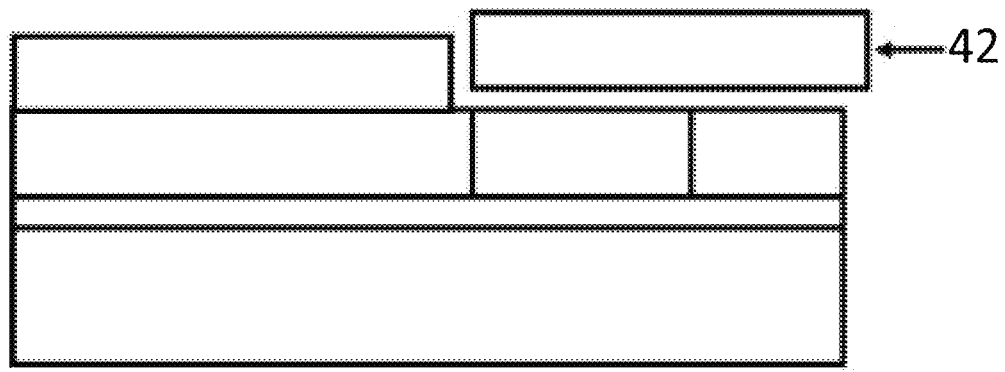
FIG. 6 is a schematic diagram of epitaxially growing a second core region of a second sub-device according to an embodiment of the present disclosure.

Referring to FIG. 6, the second core region 42 of the second sub-device 200 is similar to the first core region 41 of the first sub-device 100, and its material composition and thickness can be the same as or different from those of the first core region 41 of the first sub-device 100.

The process first performs a photolithography process on the structure of FIG. 5 to protect the portion of the first core layer 44 (i.e., the first core region 41) of the first sub-device 100 that needs to be retained, and then removes the first core layer 44 in the region corresponding to the second core region 42 of the second sub-device 200 using a dry etching or wet etching process. Further, the second core region 42 of the second sub-device 200 may be epitaxially grown at the etched region.

(6) The interface of the first sub-device 100 and the second sub-device 200 is selectively etched, followed by epitaxial growth of the optical transmission region 43.

Figure 7:
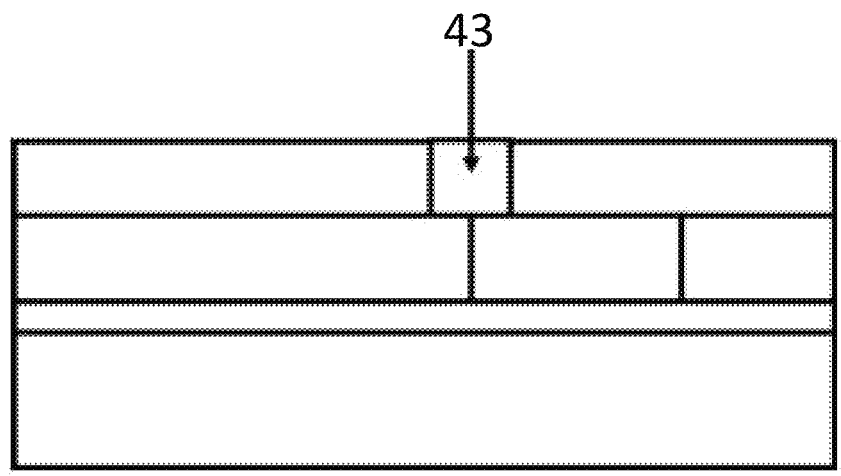
FIG. 7 is a schematic diagram of epitaxially growing an optical transmission region after selectively etching at an interface of the core regions of the first sub-device and the second sub-device according to an embodiment of the present disclosure.

Referring to FIG. 7, the material of the optical transmission region 43 can be a multinary semiconductor compound such as InGaAsP, which is used to enhance the optical coupling efficiency between the two sub-devices within the waveguide. This process first involves performing photolithography on the structure shown in FIG. 6 to protect the portions of the first core region 41 of the first sub-device 100 and the second core region 42 of the second sub-device 200 that need to be retained. Subsequently, a dry etching or wet etching process is utilized to remove the unprotected portions of the core regions at their interface. Furthermore, the optical transmission region 43 can be epitaxially grown in the etched region.

The thickness of the optical transmission region 43 may be greater than, less than, or equal to the thickness of the first core region 41 of the first sub-device 100 and the second core region 42 of the second sub-device 200.

The relative positions of the optical transmission region 43 and the bottom isolation region 33 are not fixed, i.e., the left end face of the optical transmission region 43 can be located on the left, in the middle, or on the right of the bottom isolation region 33.

(7) The top conductive regions of the first sub-device 100 and the second sub-device 200 are epitaxially grown.

Figure 8:
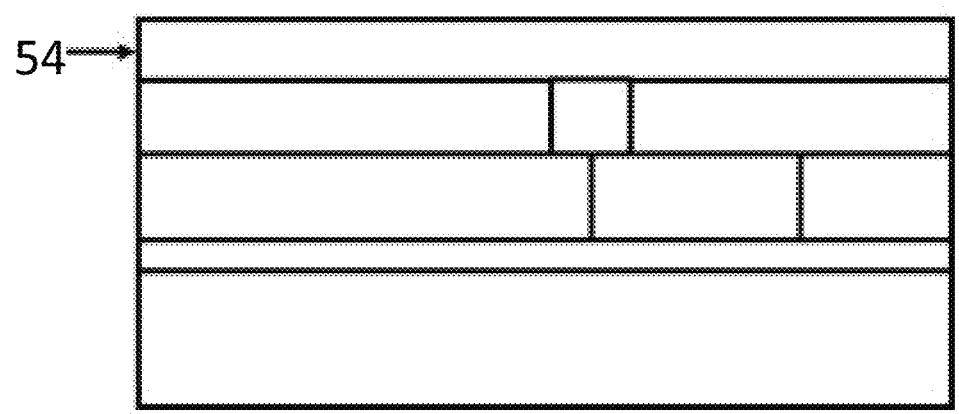
FIG. 8 is a schematic diagram of epitaxially growing top conductive regions of the first sub-device and the second sub-device according to an embodiment of the disclosure.

The top conductive regions of the first sub-device 100 and the second sub-device 200 can utilize the same or different epitaxial materials, corresponding to a process of either single epitaxy or double epitaxy. When the top conductive regions of the first sub-device 100 and the second sub-device 200 use the same epitaxial material, a single epitaxial growth is employed, which means that the first conductive layer 54 is epitaxially grown directly on the core layer, as shown specifically in FIG. 8.

(8) A portion of the top conductive regions at the interface of the first sub-device 100 and the second sub-device 200 is selectively etched or ion implanted to form a top isolation region 53.

Figure 9:
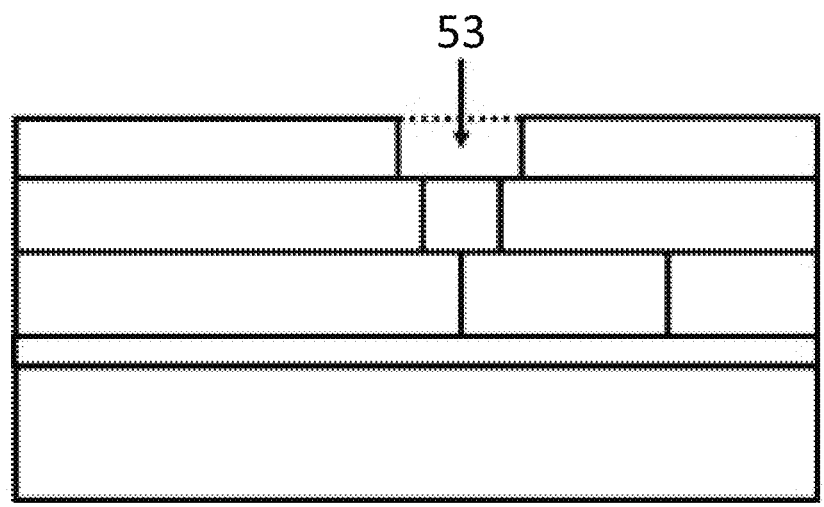
FIG. 9 is a schematic diagram of forming a top isolation region according to an embodiment of the disclosure.

Referring to FIG. 9, the top isolation region 53 enables top electrical isolation of the first sub-device 100 and the second sub-device 200.

The relative positions of the optical transmission region 43 and the top isolation region 53 are not fixed, i.e., the left end face of the optical transmission region 43 can be located on the left, in the middle, or on the right of the top isolation region 53.

Hereto, the first bottom conductive region 31, the first core region 41 and the first top conductive region 51 constitute the first sub-device 100; the second bottom conductive region 32, the second core region 42, and the second top conductive region 52 form the second sub-device 200. The first sub-device 100 and the second sub-device 200 achieve bottom electrical isolation through the bottom isolation region 33 and top electrical isolation through the top isolation region 53.

The photonic integrated chip structure provided by the disclosure achieves electrical isolation at the bottom by arranging a bottom isolation region 33 between two adjacent bottom conductive regions, with the type of dopant in the bottom isolation region 33 being opposite to that in the adjacent bottom conductive regions, thereby forming an inversion blocking junction. Electrical isolation between two adjacent top conductive regions is achieved through a top isolation region 53. This realizes P\N electrical isolation among the discrete devices within the integrated chip, enabling P\N dual-side RF driving of the devices without cross-talk interference to other devices.

The foregoing is merely a few embodiments of the present application, and does not limit the present application in any form. Although the present application has disclosed the above in terms of preferred embodiments, they are not intended to limit the present application. Those skilled in the art can make some changes or modifications by using the above-disclosed technical content without departing from the scope of the technical solution of the present application, which is equivalent to equivalent embodiments and falls within the scope of the technical solution.

What is claimed is:

1. A photonic integrated chip structure, comprising:
    a substrate;
    a buffer layer, formed on the substrate;
    a bottom conductive layer, formed on the buffer layer, which comprises a plurality of bottom conductive regions, wherein a bottom isolation region is arranged between two adjacent bottom conductive regions, the bottom isolation region is configured to isolate two adjacent bottom conductive regions; the type of dopant in the bottom isolation region is opposite to that in the adjacent bottom conductive regions;
    a core layer, formed on the bottom conductive layer, which comprises a plurality of core regions, wherein the core regions are in one-to-one correspondence with the bottom conductive regions; an optical transmission region is arranged between two adjacent core regions;
    a top conductive layer, formed on the core layer, which comprises a plurality of top conductive regions, wherein the top conductive regions are in one-to-one correspondence with the core regions, and a top isolation region is arranged between two adjacent top conductive regions; and
    a distance between a left edge of the bottom isolation region and a left edge of the optical transmission region and a distance between a right edge of the bottom isolation region and a right edge of the optical transmission region are both less than or equal to 10 um.

2. The photonic integrated chip structure of claim 1, wherein the type of dopant in the bottom conductive region is opposite to that in the buffer layer; and
    the type of the substrate is P-type, N-type or semi-insulating.

3. The photonic integrated chip structure of claim 1, wherein the top isolation region is formed by an etching process or a doping process;
    a width of the top isolation region is greater than a width of the optical transmission region; and
    a distance between a left edge of the top isolation region and a left edge of the optical transmission region and a distance between a right edge of the top isolation region and a right edge of the optical transmission region are both greater than or equal to 1 um.

4. The photonic integrated chip structure of claim 1, wherein the bottom isolation region is a P-doped or N-doped semiconductor layer.

5. The photonic integrated chip structure of claim 1, wherein a thickness of the bottom conductive region is greater than or equal to 500 nm; and
    a difference in thickness of the bottom isolation region and the bottom conductive region is no more than 300 nm.

6. The photonic integrated chip structure of claim 1, wherein the material of the optical transmission region is a multinary semiconductor compound.

7. A fabrication method based on the photonic integrated chip structure of claim 1, comprising:
    forming the buffer layer on the substrate;
    forming the bottom isolation region on the buffer layer, and forming the bottom conductive regions on both sides of the bottom isolation region;
    forming the corresponding core regions on the bottom conductive regions, and forming the optical transmission region between two adjacent core regions; and
    forming the corresponding top conductive regions on the core regions, and forming the top isolation region between two adjacent top conductive regions.

8. The method of claim 7, wherein forming the bottom isolation region on the buffer layer, and forming the bottom conductive regions on both sides of the bottom isolation region specifically comprises:
    forming a bottom isolation layer on the buffer layer, and performing an etching process on the bottom isolation layer to obtain the bottom isolation region; and
    epitaxially growing the bottom conductive regions on regions on both sides of the bottom isolation region on the buffer layer.

* * * * *